(12) United States Patent
Kim

(10) Patent No.: US 11,316,111 B2
(45) Date of Patent: Apr. 26, 2022

(54) METHOD FOR MANUFACTURING DISPLAY DEVICE USING A MASK FRAME

(71) Applicant: Samsung Display Co., Ltd., Yongin-si (KR)

(72) Inventor: Seil Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 70 days.

(21) Appl. No.: 16/701,024

(22) Filed: Dec. 2, 2019

(65) Prior Publication Data

US 2020/0251656 A1 Aug. 6, 2020

(30) Foreign Application Priority Data

Feb. 1, 2019 (KR) .................. 10-2019-0013760

(51) Int. Cl.
| | |
|---|---|
| *H01L 21/00* | (2006.01) |
| *H01L 51/00* | (2006.01) |
| *H01L 27/32* | (2006.01) |
| *C23C 16/52* | (2006.01) |
| *H01L 51/56* | (2006.01) |
| *C23C 16/04* | (2006.01) |

(52) U.S. Cl.
CPC ........ *H01L 51/0011* (2013.01); *C23C 16/042* (2013.01); *C23C 16/52* (2013.01); *H01L 27/3244* (2013.01); *H01L 51/001* (2013.01); *H01L 51/56* (2013.01)

(58) Field of Classification Search
CPC . H01L 51/0011; H01L 27/3244; H01L 51/56; H01L 51/001; C23C 16/52; C23C 16/042; C23C 14/042; C23C 14/24; C23C 14/34
See application file for complete search history.

(56) References Cited

U.S. PATENT DOCUMENTS

| | | | | |
|---|---|---|---|---|
| 4,391,511 A | * | 7/1983 | Akiyama .................. | G03F 7/24 269/21 |
| 5,800,949 A | * | 9/1998 | Edo .......................... | G03F 9/70 378/35 |
| 9,932,662 B2 | | 4/2018 | Lee | |
| 9,953,828 B2 | | 4/2018 | Oh et al. | |

(Continued)

FOREIGN PATENT DOCUMENTS

| | | |
|---|---|---|
| KR | 10-2016-0107405 | 9/2016 |
| KR | 10-2017-0135013 | 12/2017 |

(Continued)

*Primary Examiner* — Caleb E Henry
(74) *Attorney, Agent, or Firm* — H.C. Park & Associates, PLC

(57) ABSTRACT

A mask assembly for manufacturing a display device, the mask assembly includes: a mask frame including a pair of first side portions arranged in a first direction, a pair of second side portions arranged in a second direction intersecting the first direction, and an opening portion defined by the first side portions and the second side portions; a mask sheet arranged on the opening portion of the mask frame, fixed on the mask frame, and including a plurality of openings; and a support member attached to at least one of the first side portions and the second side portions of the mask frame with tensile force applied.

5 Claims, 10 Drawing Sheets

(56) References Cited

U.S. PATENT DOCUMENTS

| | | | | |
|---|---|---|---|---|
| 2003/0221614 | A1* | 12/2003 | Kang | C23C 14/042 |
| | | | | 118/504 |
| 2007/0024182 | A1* | 2/2007 | Lee | H01J 9/227 |
| | | | | 313/500 |
| 2010/0079742 | A1* | 4/2010 | Kato | G03B 27/58 |
| | | | | 355/72 |
| 2014/0326780 | A1* | 11/2014 | Han | B23K 37/0461 |
| | | | | 228/103 |
| 2014/0340663 | A1* | 11/2014 | Scaccabarozzi | G03F 7/70916 |
| | | | | 355/67 |
| 2015/0011075 | A1* | 1/2015 | Han | C23C 14/54 |
| | | | | 438/478 |
| 2017/0342541 | A1* | 11/2017 | Bangert | H01L 21/67712 |
| 2018/0087143 | A1 | 3/2018 | Moon et al. | |

FOREIGN PATENT DOCUMENTS

| | | |
|---|---|---|
| KR | 10-2018-0034771 | 4/2018 |
| KR | 10-2018-0038093 | 4/2018 |
| KR | 10-1897209 | 9/2018 |

* cited by examiner

METHOD FOR MANUFACTURING DISPLAY DEVICE USING A MASK FRAME

CROSS-REFERENCE TO RELATED APPLICATION

This application claims priority from and the benefit of Korean Patent Application No. 10-2019-0013760, filed on Feb. 1, 2019, which is hereby incorporated by reference for all purposes as if fully set forth herein.

BACKGROUND

Field

Exemplary implementations of the invention relate generally to a mask assembly apparatus and a method, and more specifically, to a mask assembly for a display, an apparatus for manufacturing a display device including the mask assembly, and a method of manufacturing the display device.

Discussion of the Background

Mobile electronic apparatus is widely used. For mobile electronic apparatuses, not only miniaturized electronic apparatuses such as mobile phones, but also, recently, tablet personal computers (PC) have been widely used.

To support various functions, a mobile electronic apparatus includes a display device to provide visual information such as an image to a user. Recently, as parts for driving a display device have been miniaturized, a portion of an electronic apparatus occupied by the display device has gradually increased and a bendable structure permitting the display to have a predetermined angle in a flat state is under development. Display devices may be manufactured by mask assemblies having fine patterns through which deposition material is applied to a substrate to produce the display device.

The above information disclosed in this Background section is only for understanding of the background of the inventive concepts, and, therefore, it may contain information that does not constitute prior art.

SUMMARY

Applicant discovered that during the process of fabricating a mask assembly for a display, the mask frame can become deformed after a mask sheet is attached to the mask frame. As a result, a defect may occur in a display device manufactured by depositing deposition material using the deformed mask assembly because the deformed mask has a pattern different from the pattern designed for the display substrate.

Mask assemblies for display devices constructed according to the principles and exemplary implementations of the invention are capable of manufacturing a display device with a fine deposition pattern since the mask assembly can maintain the initially designed shape of the mask frame.

For example, one or more support members for the mask assembly constructed according to the principles and exemplary embodiments of the invention can be selectively attached to the mask frame with tensile force applied, or removed from the mask frame, which thereby corrects deformation of the mask assembly through a simple structure without compromising the integrity of the mask assembly.

Apparatus for manufacturing a display device including the mask assembly constructed according to the principles and exemplary implementations of the invention, and a method of manufacturing the display device according to the principles of the invention and are capable of correcting deformation of the mask frame that occurs during a deposition process simply and quickly, thereby reducing manufacturing time and manufacturing costs of the display device.

The apparatus for manufacturing a display device and the method of manufacturing the display device according to the principles and exemplary embodiments of the invention produce a display device including an accurate pattern by using a mask assembly with minimum deformation, and minimizes the defect rate while a display device is manufactured.

Additional features of the inventive concepts will be set forth in the description which follows, and in part will be apparent from the description, or may be learned by practice of the inventive concepts.

According to an aspect of the invention, a mask assembly for manufacturing a display device, the mask assembly includes: a mask frame including a pair of first side portions arranged in a first direction, a pair of second side portions arranged in a second direction intersecting the first direction, and an opening portion defined by the first side portions and the second side portions; a mask sheet arranged on the opening portion of the mask frame, fixed on the mask frame, and including a plurality of openings; and a support member attached to at least one of the first side portions and the second side portions of the mask frame with tensile force applied.

The at least one of the first side portions and the second side portions of the mask frame may include a groove, and the support member may include a stick disposed across the groove.

A length of the groove may be less than the length of one side of the opening of the mask frame.

A width of the groove may be about ½ or less of a width of the at least one side portions in which the groove is formed.

The support stick may be disposed across the groove in at least one of a lengthwise direction of the groove and a width direction of the groove.

The support member may include a support stick detachably attached to the mask frame to enable detachment from the mask frame without compromising the integrity of the mask assembly depending on deformation of the mask frame.

The support member may include a plurality of first and second support sticks, and at least one of the first support sticks may be attached to one of the first side portions of the mask frame, and at least one of the second support sticks may be attached to the other of the first side portions of the mask frame.

The number of the first support sticks and the number of the second support sticks may be different from each other.

According to another aspect of the invention, an apparatus for manufacturing a display device includes: a chamber in which a display substrate is arranged; a mask assembly arranged inside the chamber to face the display substrate; and a deposition source arranged inside the chamber to face the mask assembly, wherein the mask assembly includes: a mask frame including a pair of first side portions arranged in a first direction, a pair of second side portions arranged in a second direction, and an opening portion defined by the first side portions and the second side portions; a mask sheet arranged on the mask frame, fixed on the opening portion of the mask frame, and including a plurality of openings; and a support member attached to at least one of the first side portions and the second side portions of the mask frame with tensile force applied.

The at least one of the first side portions and the second side portions of the mask frame may include a groove, and the support stick member may include a support stick disposed across the groove.

The support stick may be disposed across the groove in at least one of a lengthwise direction of the groove and a width direction of the groove.

A length of the groove may be less than the length of one side of the opening of the mask frame, or a width of the groove may be about ½ or less of a width of the at least one side portions in which the groove is formed.

The support member may include a support stick detachably attached to the mask frame to enable detachment from the mask frame without compromising the integrity of the mask assembly depending on deformation of the mask frame.

The support stick may include a plurality of first and second support sticks, at least one of the first support sticks may be attached to one of the first side portions of the mask frame, and at least one of the second support sticks may be attached to the other of the first side portions of the mask frame.

The number of the first support sticks and the number of the second support sticks may be different from each other.

According to still another aspect of the invention, a method of manufacturing a display device includes: sensing deformation of a mask frame; correcting the deformation of the mask frame by selectively attaching a support stick on the mask frame or removing the support stick from the mask frame; and arranging a mask assembly including the mask frame in which the deformation has been corrected inside a deposition chamber, and then supplying and depositing a deposition material on a display of the display device substrate by using a deposition source.

The step of attaching a support member to the mask frame may include arranging and fixing the support stick on the mask frame with tensile force applied.

The support member may include a plurality of first and second support sticks, and the method may further include the step of: arranging the first support sticks and the second support sticks on portions of the mask frame depending on the deformation of the mask frame, the portions of the mask frame being different from each other with respect to a center of the mask frame.

The number of the first support sticks and the number of the second support sticks may be different from each other.

A groove may be disposed in the mask frame, and the support member may cross the groove in a width direction or lengthwise direction of the groove.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
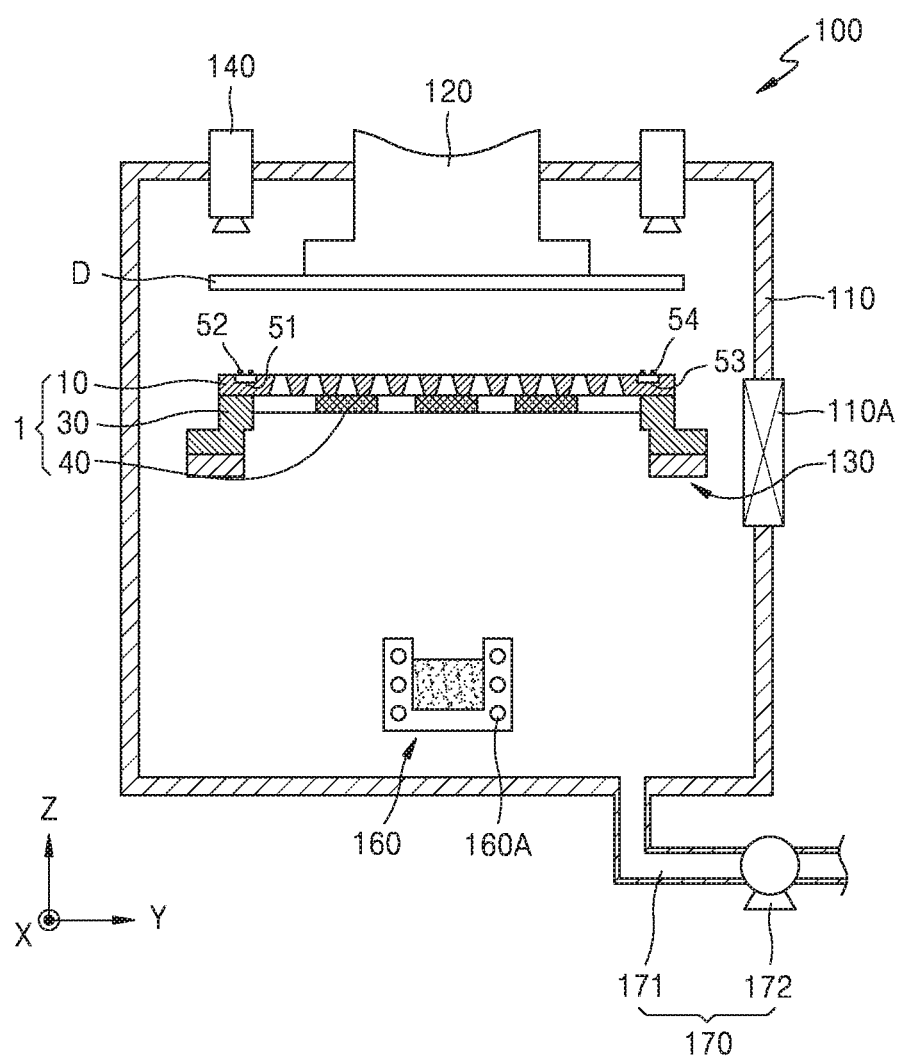
FIG. 1 is a cross-sectional view of an exemplary embodiment of an apparatus for manufacturing a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
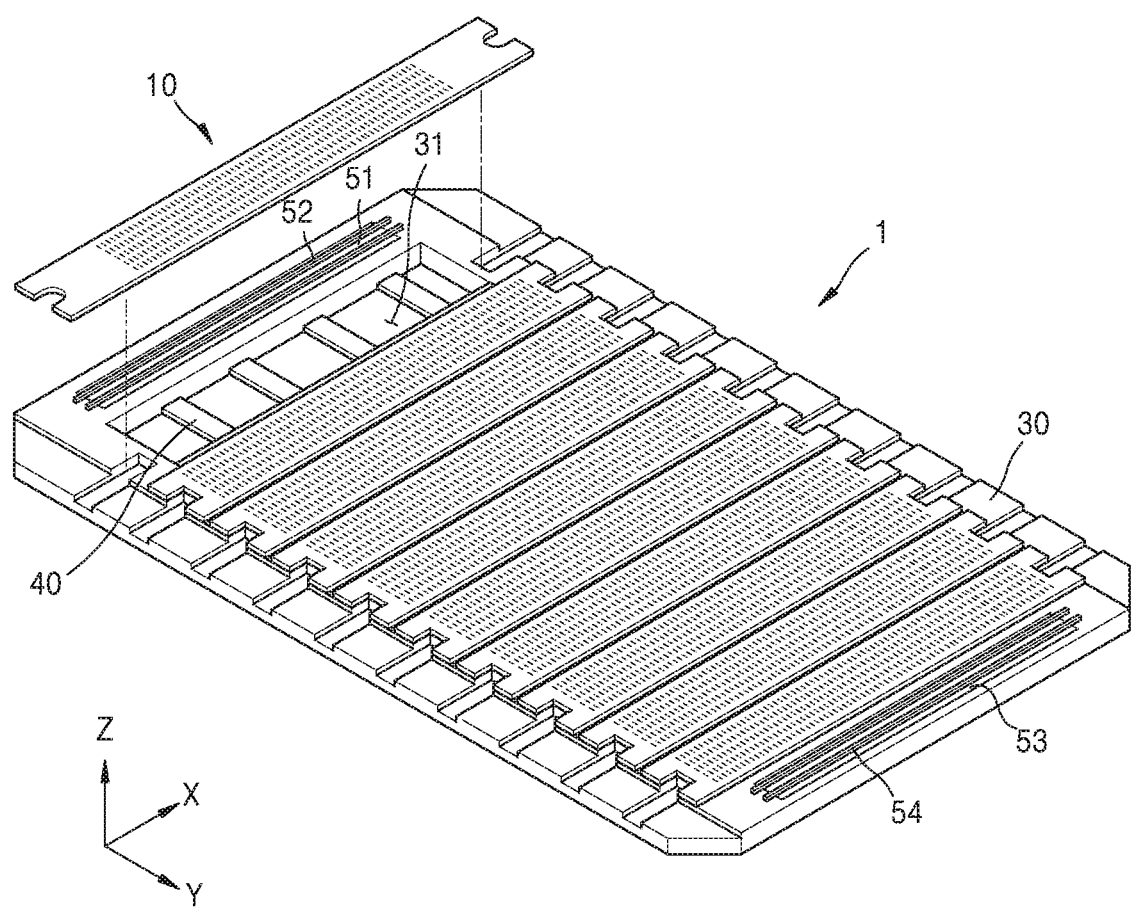
FIG. 2 is a perspective view of the mask assembly shown in FIG. 1
Figure 3:
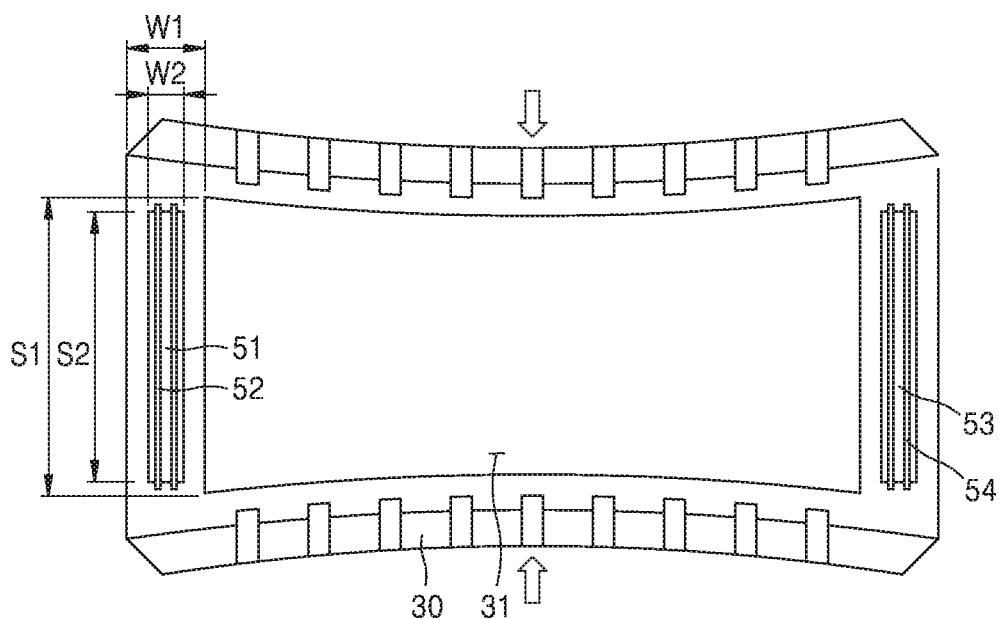
FIG. 3 is a plan view of an exemplary embodiment of a first deformed shape of the mask frame shown in FIG. 2.
Figure 4:
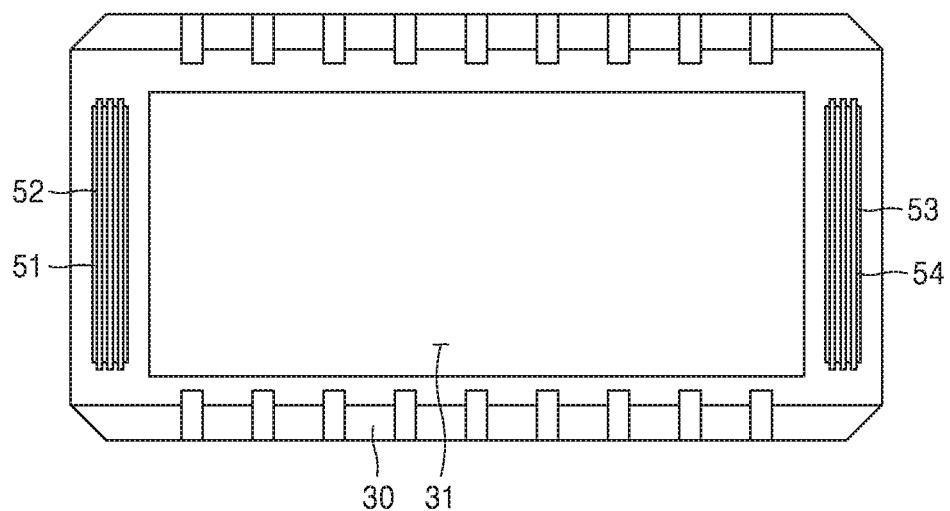
FIG. 4 is a plan view of the mask frame shown in FIG. 3 after the deformation has been corrected.

FIG. 1 is a cross-sectional view of an exemplary embodiment of an apparatus 100 for manufacturing a display device constructed according to the principles of the invention, FIG. 2 is a perspective view of the mask assembly shown in FIG. 1, FIG. 3 is a plan view of an exemplary embodiment of a first deformed shape of the mask frame shown in FIG. 2, and FIG. 4 is a plan view of the mask frame shown in FIG. 3 after the deformation has been corrected.

Referring to FIGS. 1 to 4, the apparatus 100 for manufacturing a display device may include a chamber 110, a first support 120, a second support 130, a vision unit (such as a camera) 140, a mask assembly 1, a deposition source 160, and a pressure adjustor 170.

A space may be formed inside the chamber 110. A portion of the chamber 110 may be open. A gate valve 110A may be installed in the open portion of the chamber 110 to selectively open/close the open portion of the chamber 110.

The first support 120 may support a display substrate D. In this case, the first support 120 may support the display substrate D in various ways. For example, the first support 120 may include an electrostatic chuck or an adhesive chuck. In another exemplary embodiment, the first support 120 may include a frame configured to seat a portion of the display substrate D thereon and support the display substrate D, and a clamp configured to grip and fix a portion of the display substrate D. The first support 120 is not limited thereto and may include any apparatus that may support the display substrate D. Hereinafter, for convenience of description, the case where the first support 120 includes an electrostatic chuck or an adhesive chuck is mainly described in detail.

The first support 120 may include at least one of a permanent magnet and an electromagnet such that the mask assembly 1 and the display substrate D are closely attached to each other. In another exemplary embodiment, in the case where the first support 120 includes a frame or a clamp, at least one of a magnet or an electromagnet having a shape similar to that of the first support 120 shown in FIG. 1 may be further provided in order that the display substrate D and the mask assembly 1 can be more closely attached.

The second support 130 may seat the mask assembly 1 thereon. The second support 130 may finely adjust the mask assembly 1 in at least two different directions.

The vision unit 140 may capture a location of the display substrate D and the mask assembly 1. The display substrate D and the mask assembly 1 may be aligned by moving at least one of the display substrate D and the mask assembly 1 based on an image captured by the vision unit 140.

The mask assembly 1 may include a mask frame 30, a mask sheet 10, a support frame 40, and a support member, which may be in the form of a support stick 52, 54.

The mask frame 30 may include a plurality of frames. In this case, the plurality of frames may have a lattice shape or a quadrangular shape, and a space may be formed in the mask frame 30. In another exemplary embodiment, one opening 31 may be formed in a central portion of the mask frame 30. Hereinafter, for convenience of description, the case where the mask frame 30 includes one opening 31 is mainly described in detail.

The mask frame 30 may define a region through which a deposition material passes. In this case, the opening 31 may have a quadrangular shape. For example, the opening 31 may have a rectangular shape or a square shape. An edge of the mask frame 30 may have a quadrangular shape. The mask frame 30 may have a pair of first side portions (i.e., long side) and a pair of second side portions (i.e., short side). For example, a long side of the mask frame 30 may be arranged in a Y-direction of FIG. 2, and a short side of the mask frame 30 may be arranged in an X-direction of FIG. 2. Accordingly, the opening 31 of the mask frame 30 may be formed as an open area defined by the long side and the short side of the mask frame 30.

A deformation prevention groove 51, 53 may be arranged in a short side of the mask frame 30. The deformation prevention groove 51, 53 may reduce or prevent deformation of the mask frame 30 due to forces or stresses imposed thereon is deformed. Also, the deformation prevention groove 51, 53 may be arranged in the opposite side of the mask frame 30, i.e., not the side of the mask frame 30 that faces the deposition source 160, and thus, deposition material may not accumulate in the deformation prevention groove 51, 53.

The deformation prevention groove 51, 53 may have a quadrangular shape in a plan view. In this case, a planar shape of the deformation prevention groove 51, 53 may include a rectangle. Particularly, a long side of the deformation prevention groove 51, 53 may be arranged in the same direction as a direction in which a short side of the mask frame 30 is arranged.

Referring to FIG. 3, a length S2 of the deformation prevention groove 51, 53 may be less than the length S1 of a short side of the opening 31. In the case where the length S2 of the deformation prevention groove exceeds the length S1 of the short side of the opening 31, deformation of the deformation prevention groove 51, 53 becomes excessive and thus the degree by which the mask frame 30 is twisted becomes serious and the strength of the short side of the mask frame 30 may be compromised.

Also, the width W2 of the deformation prevention groove may be less than the width W1 of a short side of the mask frame 30. For example, the width W2 of the deformation prevention groove may be about ½ or less of the width W1 of the short side of the mask frame 30. In the case where the width W2 of the deformation prevention groove exceeds about ½ of the width W1 of the short side of the mask frame 30, strength of the short side of the mask frame 30 is reduced and thus the mask frame 30 may be compromised or easily deformed by heat, etc.

The depth of the deformation prevention groove may be less than a maximum thickness of the short side of the mask frame 30. In this case, when the depth of the deformation prevention groove is too large, durability of the mask frame 30 may be reduced.

The deformation prevention groove may include a first deformation prevention groove 51 arranged in one of the short sides of the mask frame 30, and a second deformation prevention groove 53 arranged in the other of the short sides of the mask frame 30.

The mask sheet 10 may be arranged and fixed on a top surface of the mask frame 30. Particularly, the mask sheet 10 may be fixed on the mask frame 30 with tensile force applied.

The mask sheet 10 may be provided in a stick shape. For example, the mask sheet 10 may include a plurality of mask sheets 10. Each of the mask sheets 10 may be arranged such that a short side direction (i.e., X-direction of FIG. 2) of the mask frame 30 is the same as a lengthwise direction of the mask sheet 10. Also, the plurality of mask sheets 10 may be adjacent to each other in a long side direction (i.e., Y-direction of FIG. 2) of the mask frame 30. A plurality of openings are apart from each other in the mask sheet 10, and each opening may be uniformly arranged in an entire surface of the mask sheet 10.

The support frame 40 may be installed on the mask frame 30 to support the mask sheet 10. In this case, the support frame 40 may be installed on the mask frame 30 such that the support frame 40 is parallel to at least one of a long side and a short side of the mask frame 30. Also, the support frame 40 may be arranged in an inner space of the mask frame 30. Particularly, a portion of the support frame 40 may be arranged in a lengthwise direction (e.g. the short side of the mask frame 30) of the mask sheet 10 and thus arranged between the mask sheets 10 that are adjacent to each other to prevent deposition material from leaking out between the mask sheets 10. Also, another portion of the support frame 40 may be arranged to form a predetermined angle with respect to the lengthwise direction of the mask sheet 10. Particularly, the support frame 40 may be perpendicular to the lengthwise direction of the mask sheet 10. For example, the support frame 40 may be parallel to the long side of the mask frame 30. In this case, the support frame 40 may support the mask sheet 10.

The support stick 52, 54 may be arranged on the mask frame 30 to correct deformation of the mask frame 30. For example, the support stick 52, 54 may correct deformation of the mask frame 30 by being attached to the mask frame 30 or being removed from the mask frame 30 on which the support stick is attached. Attaching or removing the support stick to the mask frame changes the forces acting upon the frame as discussed herein.

The support stick 52, 54 may be formed in a thin plate shape. In this case, the support stick 52, 54 may be formed from substantially the same material as that of the mask sheet 10 or that of the mask frame 30. Particularly, the support stick may include a material that does not easily corrode.

In an exemplary embodiment, the support stick 52, 54 may be arranged to cross the deformation prevention groove 51, 53 in the lengthwise direction (e.g. an X-direction of FIG. 2) of the deformation prevention groove 51, 53 and may be greater than the length of the deformation prevention groove 51, 53. For example, the length of the support stick 52, 54 may be greater than the length of a long side (S2 of FIG. 3) of the deformation prevention groove 51, 53 by 15 mm or more. In another exemplary embodiment, the support stick 52, 54 may be arranged to cross the deformation prevention groove in a width direction (e.g. a Y-direction of FIG. 2) of the deformation prevention groove 51, 53. In this case, the length of the support stick may be greater than a width (W2 of FIG. 3) of the deformation prevention groove.

The support stick 52, 54 may be fixed on the mask frame 30 with tension (or with tensile force applied) through welding. For example, the support stick 52, 54 may be fixed on the mask frame 30 through arc welding or laser welding, etc.

The support stick may include a first support stick 52 arranged on the first deformation prevention groove 51 and a second support stick 54 arranged on the second deformation prevention groove 53. At least one of the first support stick 52 and the second support stick 54 may include a plurality of support sticks. For example, the first support stick 52 may be provided as a plurality of support sticks, and the second support stick 54 may be provided as a single support stick. In another exemplary embodiment, the first support stick 52 may be provided as a single support stick, and the second support stick 54 may be provided as a plurality of support sticks. In another exemplary embodiment, both the first support stick 52 and the second support stick 54 may be provided as a plurality of support sticks. Hereinafter, for convenience of description, the case where the first support stick 52 and the second support stick 54 are provided as a plurality of support sticks is mainly described in detail.

In an exemplary embodiment, the same number of first support sticks 52 and second support sticks 54 may be arranged initially and then the number of first support sticks 52 and the number of second support sticks 54 may be changed to be different from each other while deformation of the mask frame 30 is corrected. Also, in another exemplary embodiment, the first support stick 52 and the second support stick 54 may not be arranged on the mask frame 30 initially and then may be arranged on the mask frame 30 so as to correct deformation of the mask frame 30. In another exemplary embodiment, after a different number of first support sticks 52 and second support sticks 54 is initially arranged on the mask frame 30, the number of first support sticks 52 and the number of second support sticks 54 may be adjusted to the same number or to different numbers while deformation of the mask frame 30 is corrected. However, hereinafter, for convenience of description, the case where after the same number of first support sticks 52 and second support sticks 54 on the mask frame 30 are initially arranged, and the number of first support sticks 52 and the number of second support sticks 54 are adjusted so as to correct deformation of the mask frame 30 is mainly described in detail.

A support stick 52, 54 may be arranged on the short side of the mask frame 30 as described above. In this case, the support stick 52, 54 may be fixed on the mask frame 30 with tensile force applied thereto. Specifically, after tensile force is applied to the support stick, the support stick 52, 54 may be fixed on the mask frame 30 through welding. After that, when a clamp, etc. that applies tensile force is removed from the support stick, the support stick 52, 54 may spontaneously restore to its original state while the tensile force that has been applied is removed. In this case, since the support stick 52, 54 is fixed on the mask frame 30, restoring force of the support stick 52, 54 itself may provide compression force to the mask frame 30.

The mask assembly 1 may be manufactured by fixing the mask sheet 10 on the mask frame 30 with tensile force applied. In this case, the support frame 40 may be arranged and fixed on the mask frame 30. After that, the mask sheet 10 is arranged on the mask frame 30 with tensile force applied, and the mask sheet 10 may be fixed on the mask frame 30 through welding.

The support stick 52, 54 may be attached to mask frame 30 after the mask frame 30 is manufactured, or in the case where the support frame 40 is arranged on the mask frame 30, the support stick 52, 54 may be attached to the mask frame 30. In another exemplary embodiment, the support stick 52, 54 may be fixed on the mask frame 30 after the mask sheet 10 is fixed on the mask frame 30. Hereinafter, for convenience of description, the case where the support stick 52, 54 is simultaneously arranged on the mask frame 30 while the support frame 40 is arranged on the mask frame 30 is mainly described in detail.

After the plurality of mask sheets 10 are arranged on the mask frame 30, the mask frame 30 may not maintain its initial shape and may be deformed. In this case, since the mask sheet 10 may be deformed and/or arranged at a location different from a designed location, an opening of the mask sheet 10 may not form a designed pattern.

In this case, the pattern of a deposition material that passes through the mask frame 30 and is deposited on the display substrate D may be different from a designed pattern. To resolve this issue, in the case where the mask frame 30 is deformed, deformation of the mask frame 30 may be corrected by removing the support stick 52, 54 or further adding the support stick 52, 54 on the mask frame 30.

Deposition material may be inserted at the inside of the deposition source 160 and then evaporated. In this case, the deposition source 160 may include a heater 160A, and the deposition material may be evaporated by heat applied from the heater 160A.

The deposition source 160 may be formed in various shapes. For example, the deposition source 160 may have a point deposition source form in which the entry portion thereof from which deposition material is discharged is circular. Also, the deposition source 160 may have a line deposition source form in an elongated manner in which an entry portion thereof is provided as a plurality of entry portions or an elongated hole form. Hereinafter, for convenience of description, the case where the deposition source 160 is arranged to face one point of the mask assembly 1 and has a point deposition source form is mainly described in detail.

The pressure adjustor 170 may be connected to the chamber 110 to adjust pressure of the inside of the chamber 110 such that the pressure of the inside of the chamber 110 is similar to atmospheric pressure or vacuum. In this case, the pressure adjustor 170 may include a connection pipe 171 connected to the chamber 110, and a pressure adjusting pump 172 arranged on the connection pipe 171.

A method of manufacturing a display device by using the apparatus 100 for manufacturing a display device is now described. The display substrate D may be manufactured and prepared. Also, the mask assembly 1 may be manufactured and prepared. For example, two first support sticks 52 and two second support sticks 54 may be attached on the mask frame 30.

After the mask assembly 1 is completely manufactured, whether deformation of the mask assembly 1 has occurred may be determined. Particularly, whether deformation of the mask frame 30 has occurred may be determined. In this case, whether the mask frame 30 has been deformed may be measured in various methods. For example, in an exemplary embodiment, whether the mask frame 30 has been deformed may be determined by capturing an image of the mask frame 30 and comparing the captured image of the mask frame 30 with an image set in advance. In another exemplary embodiment, whether the mask frame 30 has been deformed may be determined by capturing an X-ray image of the mask frame 30 and comparing the captured X-ray image of the mask frame 30 with an image set in advance. In another exemplary embodiment, the shape of the mask frame 30 may understood by sensing the mask frame 30 by using a laser sensor, etc., and then the shape of the mask frame 30 may be compared with an image set in advance. In this case, a method of sensing whether the mask frame 30 has been deformed is not limited to the above methods. The method of sensing whether the mask frame 30 has been deformed may include any apparatus and any method of obtaining the shape of the mask frame 30 and comparing the obtained shape with a shape set in advance by using an apparatus and a method of sensing the shape of the mask frame 30. However, hereinafter, for convenience of description, the case where whether the mask frame 30 has been deformed is determined by capturing an image of the mask frame 30 and comparing the captured image of the mask frame 30 with an image set in advance is mainly described in detail.

If it is determined that deformation of the manufactured mask frame 30 has occurred as described above, the deformation of the mask frame 30 may be corrected by removing/adding one of more of the support sticks from/to the mask frame 30. The support sticks 52, 54 may be detachably attached to the mask frame 30 to enable detachment from the mask frame 30 without compromising the integrity of the mask assembly depending on deformation of the mask frame 30. For example, the support sticks 52, 54 may be fixed on the mask frame 30 through welding and may be removed from the mask frame 30 through laser cutting. In an exemplary embodiment, some of one of the first support sticks 52 and the second support sticks 54 may be removed from the mask frame 30. In another exemplary embodiment, one of the first support sticks 52 and the second support sticks 54 may be added to the mask frame 30. In another exemplary embodiment, the first support stick 52 and the second support stick 54 may be removed from the mask frame 30, or added to the mask frame 30. In another exemplary embodiment, one of the first support stick 52 and the second support stick 54 may be removed from the mask frame 30, and the other of the first support stick 52 and the second support stick 54 may be added to the mask frame 30.

The planar area of the first support stick 52 may be the same as the planar area of the second support stick 54. For example, the length, width and thickness of the first support stick 52 may be the same as the length, width and thickness of the second support stick 54.

The pressure adjustor 170 may maintain the inside of the chamber 110 at an atmospheric pressure, and after the gate valve 110A is opened, the display substrate D and a deformation-corrected mask assembly 1 may be inserted to the inside of the chamber 110. In this case, a separate robot arm, a shuttle, etc. may be provided inside or outside the chamber 110 to transfer the display substrate D and the mask assembly 1.

When the above process is completed, the pressure adjustor 170 may maintain the inside of the chamber 110 at almost vacuum. Also, the vision unit 140 may capture images of the display substrate D and the mask assembly 1, finely drive the first support 120 and the second support 130 to finely adjust at least one of the display substrate D and the mask assembly 1, thereby aligning the display substrate D with the mask assembly 1.

The heater 160A may operate to supply a deposition material from the deposition source 160 to the mask assembly 1. The deposition material that has passed through the mask assembly 1 may be deposited in a predetermined pattern on the display substrate D.

While the above process is in progress, at least one of the deposition source 160 and the display substrate D may perform a linear motion. In another exemplary embodiment, deposition may be performed with both the deposition source 160 and the display substrate D stopped. Hereinafter, for convenience of description, the case where deposition is performed with both the deposition source 160 and the display substrate D stopped is mainly described in detail.

Therefore, since the apparatus 100 for manufacturing a display device and the method of manufacturing a display device may perform deposition with deformation of the mask sheet 10 minimized, deposition of a deposition material may be performed precisely and accurately.

Hereinafter, a method of correcting deformation of the mask frame 30 depending on a deformed shape of the mask frame 30 is described in detail.

Referring to FIG. 3, a portion of a long side of the mask frame 30 (e.g. a central portion of the long side of the mask frame 30) may be deformed inwardly toward the inside of the opening 31 compared to another portion of the long side of the mask frame 30 (e.g. two opposite ends of the long side of the mask frame 30) due to various reasons such as a difference in tensile force of each mask sheet (10 of FIG. 2), existence of external force, external temperature, etc. while the mask sheet is fixed on the mask frame 30 with tensile force applied.

To correct this deformation, at least one first support stick 52 and at least one second support stick 54 may be further added on the mask frame 30, for example. In this case, in an exemplary embodiment, the number of first support sticks 52 may be the same as the number of second support sticks 54 that are newly added to the mask frame 30. In this case, a central portion of the long side of the mask frame 30 has been deformed in advance. In another exemplary embodiment, the number of first support sticks 52 and the number of second support sticks 54 that are newly added to the mask frame 30 may be different from each other. In this case, a deformed portion of the mask frame 30 may be arranged between a center of the long side of the mask frame 30 and the two opposite ends of the long side of the mask frame 30. In this case, when the deformed portion of the mask frame 30 is further adjacent to the first deformation prevention groove 51 than the second deformation prevention groove 53, the number of first support sticks 52 that are added to the mask frame 30 may be greater than the number of second support sticks 54 that are added to the mask frame 30. In contrast, when the deformed portion of the mask frame 30 is further adjacent to the second deformation prevention groove 53 than the first deformation prevention groove 51, the number of first support sticks 52 that are added to the mask frame 30 may be less than the number of second support sticks 54 that are added to the mask frame 30.

Hereinafter, for convenience of description, the case where the central portion of the long side of the mask frame 30 has been deformed is mainly described in detail.

For example, as shown in FIG. 3, initially, two first support sticks 52 and two second support sticks 54 may be arranged on the mask frame 30. In the case where the central portion of the long side of the mask frame 30 is deformed inwardly toward the inside of the opening 31 compared to another portion of the long side of the mask frame 30, two new first support sticks 52 and two new second support sticks 54 may be attached on the mask frame 30 with tensile force applied on the mask frame 30 as shown in FIG. 4. In other words, the two new first support sticks 52 may be arranged to cross the first deformation prevention groove 51 and be fixed on the mask frame 30. Also, the two new second support sticks 54 may be arranged to cross the second deformation prevention groove 53 and be fixed on the mask frame 30.

When the new first support sticks 52 and the new second support sticks 54 are arranged on the mask frame 30 as described above, the new first support sticks 52 and the new second support sticks 54 may provide compression force to the short side of the mask frame 30. In this case, in the case where additional first support sticks 52 and second support sticks 54 are added, compression force applied to the short side of the mask frame 30 may be increased. The compression force increased at the short side of the mask frame 30 may make each long side of the mask frame 30 a substantially straight line by applying force, in a central direction of each short side of the mask frame 30, on two opposite ends of each long side of the mask frame 30.

Therefore, in the case where the mask frame 30 is deformed, the shape of the opening 31 may be maintained as a substantially rectangular shape by adding the first support sticks 52 and the second support sticks 54 and thus correcting the deformation of the mask frame 30.

Particularly, in this case, since the shape of the mask frame 30 maintains the same shape as or a substantially similar shape to the initial shape, the shape of the mask assembly 1 may be maintained at the same shape as or a substantially similar shape as the designed shape.

Figure 5:
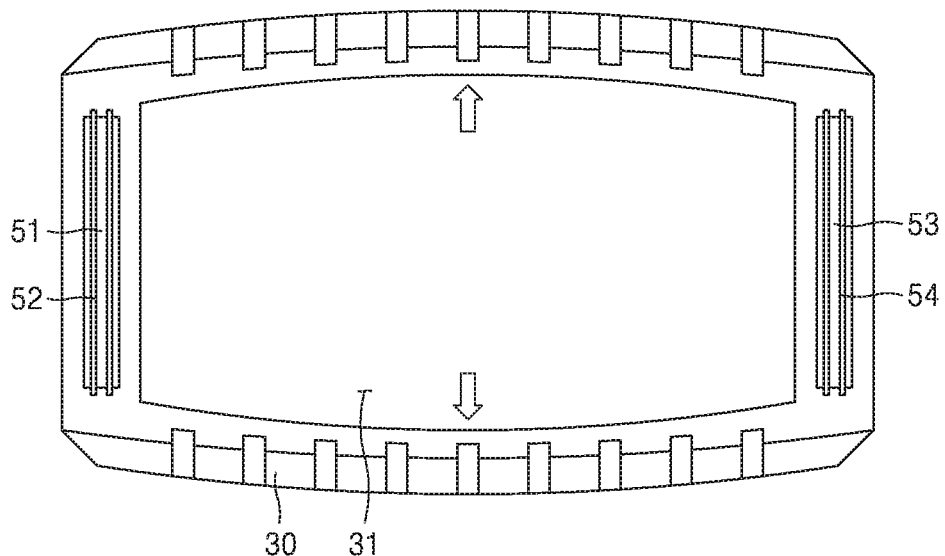
FIG. 5 is a plan view of an exemplary embodiment of a second deformed shape of the mask frame shown in FIG. 2.
Figure 6:
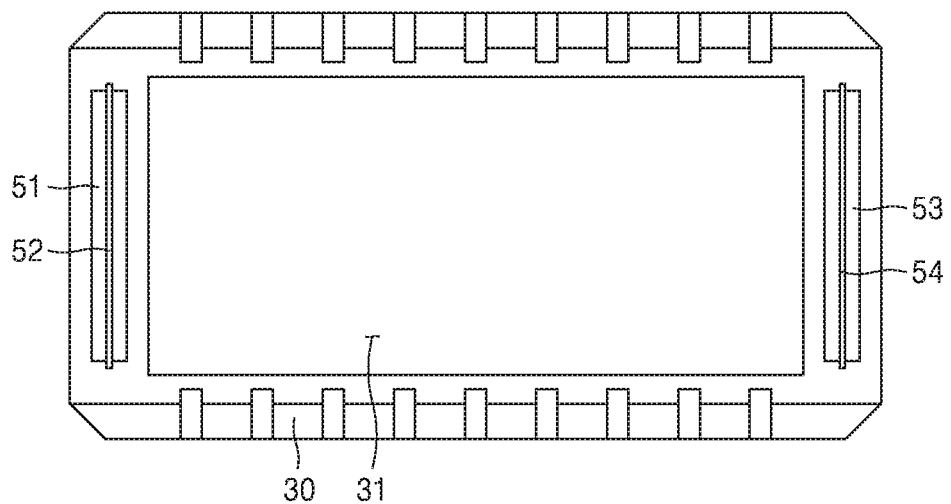
FIG. 6 is a plan view of the mask frame shown in FIG. 5 after the deformation has been corrected.

FIG. 5 is a plan view of an exemplary embodiment of a second deformed shape of the mask frame 30 shown in FIG. 2, and FIG. 6 is a plan view of the mask frame 30 shown in FIG. 5 after the deformation has been corrected.

Referring to FIGS. 5 and 6, a portion of the long side of the mask frame 30 (e.g. the central portion of the long side of the mask frame 30) may further protrude outwardly than another portion of the long side of the mask frame 30 (e.g. the two opposite ends of the long side of the mask frame 30) as shown in FIG. 5. For example, at least a portion of the long side of the mask frame 30 may protrude in an outer direction of the mask frame 30 in a convex shape.

To correct this type of deformation of the mask frame 30, some of the first support sticks 52 and the second support sticks 54 that have been attached in advance on the mask frame 30 may be removed. For example, one or two of two first support sticks 52 that have been attached in advance on the mask frame 30 may be removed from the mask frame 30. Also, one or two of two second support sticks 54 that have been attached in advance on the mask frame 30 may be removed from the mask frame 30. In an exemplary embodiment, the number of first support sticks 52 may be the same as the number of second support sticks 54 that are removed from the mask frame 30. In this case, the central portion of the long side of the mask frame 30 may be in a state of having been deformed. In another exemplary embodiment, the number of first support sticks 52 and the number of second support sticks 54 that are removed from the mask frame 30 may be different from each other. In this case, the deformed portion of the long side of the mask frame 30 may be arranged between the central portion of the long side of the mask frame 30 and the two opposite ends of the long side of the mask frame 30. Particularly, in the case where the deformed portion of the long side of the mask frame 30 is further adjacent to the first deformation prevention groove 51 than the second deformation prevention groove 53, the number of first support sticks 52 that are removed from the mask frame 30 may be less than the number of second support sticks 54 that are removed from the mask frame 30. In contrast, in the case where the deformed portion of the long side of the mask frame 30 is further adjacent to the second deformation prevention groove 53 than the first deformation prevention groove 51, the number of first support sticks 52 that are removed from the mask frame 30 may be greater than the number of second support sticks 54 that are removed from the mask frame 30.

Hereinafter, for convenience of description, the case where the central portion of the long side of the mask frame 30 has been deformed outwardly in a convex shape is mainly described in detail.

As shown in FIG. 5, in the case where the central portion of the long side of the mask frame 30 protrudes in an outer direction of the mask frame 30 (e.g. a direction away from the opening 31) than the other portions of the long side of the mask frame 30, one first support stick 52 and one second support stick 54 may be removed from the mask frame 30 as shown in FIG. 6.

Since the magnitude of compression force applied to the two opposite ends of the long side of the mask frame 30 is reduced compared to the initial state, the two opposite ends of the long side of the mask frame 30 may further protrude in the outer direction of the mask frame 30 than the initial state.

Therefore, in the case where the mask frame 30 is deformed, the shape of the opening 31 may be maintained as a rectangle by removing the first support sticks 52 and the second support sticks 54 from the mask frame 30 and thus correcting the deformation of the mask frame 30.

Particularly, since the mask frame 30 maintains a shape that is the same as or substantially similar to the initial shape, the shape of the mask assembly 1 may be allowed to maintain a shape that is the same as or substantially similar to a designed shape.

Figure 7:
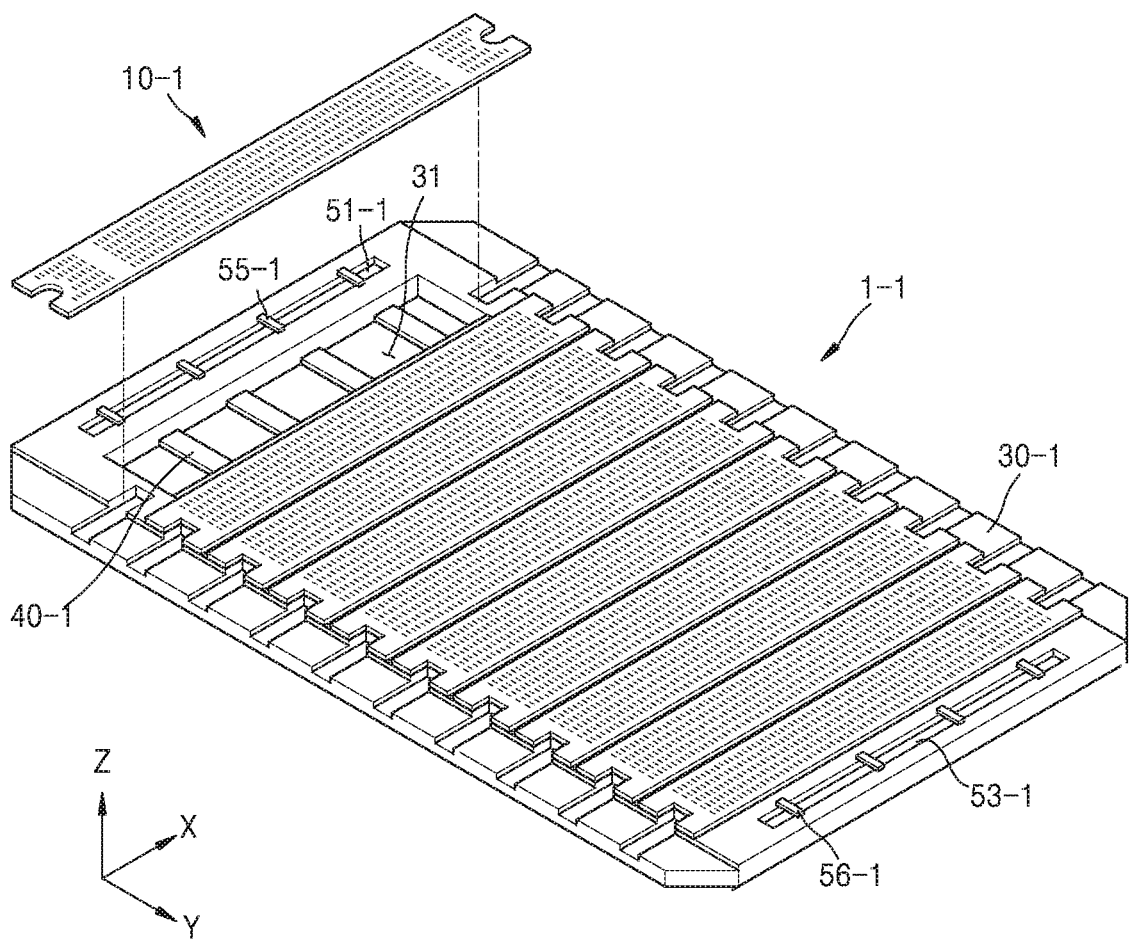
FIG. 7 is a perspective view of another exemplary embodiment of a mask assembly constructed according to the principles of the invention.

FIG. 7 is a perspective view of another exemplary embodiment of a mask assembly 1-1 constructed according to the principles of the invention.

Referring to FIG. 7, since the apparatus for manufacturing a display device is the same as or substantially similar to that shown in FIG. 1, detailed description thereof is omitted to avoid redundancy.

The mask assembly 1-1 may include a mask frame 30-1, a mask sheet 10-1, a support frame 40-1, and a support stick 55-1, 56-1. Since the mask frame 30-1, the mask sheet 10-1, and the support frame 40-1 are the same as or substantially similar to those described with reference to FIG. 2, detailed description thereof is omitted to avoid redundancy.

The support stick 55-1, 56-1 may be arranged, in a direction of a long side of the mask frame 30-1, on a short side of the mask frame 30-1. The support stick may be fixed on the mask frame 30-1 through welding, etc. with tensile force applied.

The support stick may include a third support stick 55-1 arranged to cross a first deformation prevention groove 51-1 and a fourth support stick 56-1 arranged to cross a second deformation prevention groove 53-1. In this case, the third support stick 55-1 may have substantially the same shape as the fourth support stick 56-1. For example, the length, width and thickness of the third support stick 55-1 may be the same as the length, width and thickness of the fourth support stick 56-1.

Each of the third support stick 55-1 and the fourth support stick 56-1 may be provided as at least one support stick. In the case where each of the third support stick 55-1 and the fourth support stick 56-1 is provided as a plurality of support sticks, the plurality of third support sticks 55-1 may be spaced apart from each other in a lengthwise direction (e.g., X-direction) of the first deformation prevention groove 51-1, and the plurality of fourth support sticks 56-1 may be spaced apart from each other in a lengthwise direction (e.g., X-direction) of the second deformation prevention groove 52-1.

The third support stick 55-1 and the fourth support stick 56-1 may not be arranged on the mask frame 30-1 initially, or may be arranged and fixed on the mask frame 30-1 initially. Hereinafter, for convenience of description, the case where the third support stick 55-1 and the fourth support stick 56-1 are arranged on the mask frame 30-1 initially is mainly described in detail.

In an exemplary embodiment, the same number of third support sticks 55-1 and the same number of fourth support sticks 56-1 may be arranged on the mask frame 30-1. In another exemplary embodiment, the number of third support sticks 55-1 and the number of fourth support sticks 56-1 arranged on the mask frame 30-1 may be different from each other while the mask assembly 1-1 is manufactured (an initial state). Hereinafter, for convenience of description, the case where the same number of third support sticks 55-1 and the same number of fourth support sticks 56-1 are arranged and fixed on the mask frame 30-1 is mainly described in detail.

To correct deformation of the mask frame 30-1, the third support stick 55-1 and the fourth support stick 56-1 may be removed from the mask frame 30-1, or added and attached on the mask frame 30-1 depending on the deformation of the mask frame 30-1.

Therefore, after the mask assembly 1-1 is manufactured, in the case where deformation of the mask frame 30-1 occurs while the mask assembly 1-1 is in use or after the mask assembly 1-1 is used, the deformation of the mask frame 30-1 may be corrected by adding or removing the third support stick 55-1 and the fourth support stick 56-1.

Hereinafter, a method of correcting deformation of the mask frame 30-1 when deformation of the mask frame 30-1 occurs is described in detail.

Figure 8:
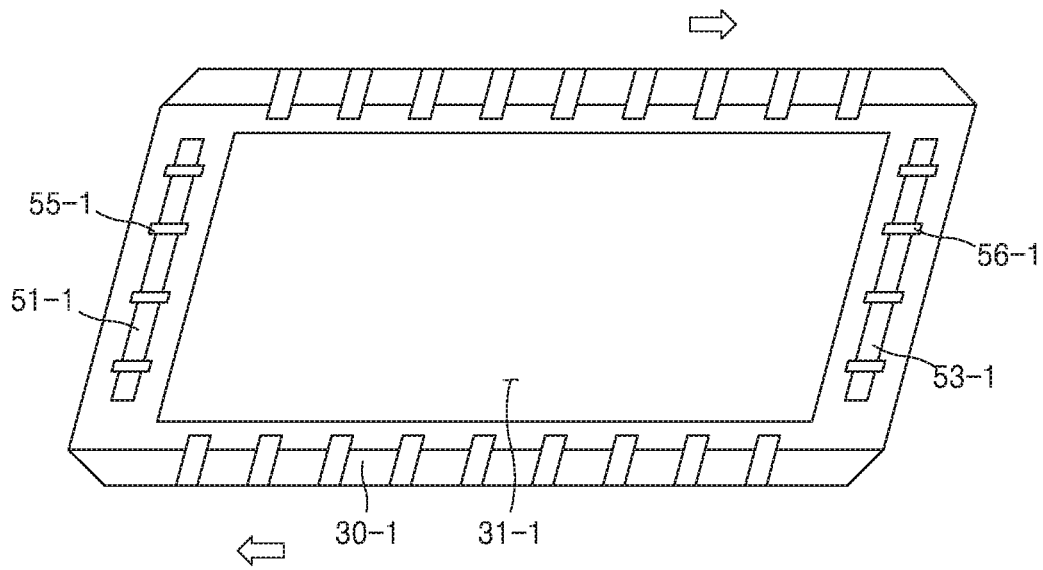
FIG. 8 is a plan view of an exemplary embodiment of a third deformed shape of a mask frame shown in FIG. 7.
Figure 9:
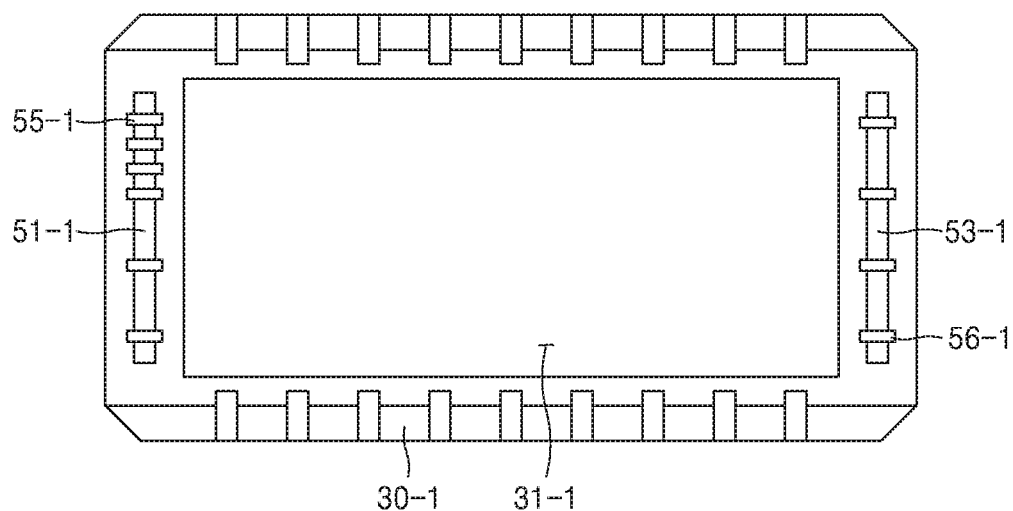
FIG. 9 is a plan view of the mask frame shown in FIG. 8 after the deformation has been corrected.

FIG. 8 is a plan view of an exemplary embodiment of a third deformed shape of the mask frame 30-1 shown in FIG. 7, and FIG. 9 is a plan view of the mask frame 30-1 shown in FIG. 8 after the deformation has been corrected.

Referring to FIGS. 8 and 9, while a mask assembly is manufactured, after the mask frame 30-1 is manufactured, while the mask frame 30-1 is used by an apparatus for manufacturing a display device, or after the mask frame 30-1 is used by the apparatus for manufacturing a display device, the mask frame 30-1 may become deformed from an initial state when only the mask frame 30-1 is manufactured, or become deformed from a state of the mask frame 30-1 having the design shape of the mask assembly.

For example, as shown in FIG. 8, one of the long sides (e.g., upper long side) of the mask frame 30-1 may move to the right of FIG. 8 and the other of the long sides (e.g., bottom long side) of the mask frame 30-1 may move to the left of FIG. 8 due to various reasons, and thus a shape of the mask frame 30-1 may vary.

In this case, deformation of the mask frame 30-1 may be corrected by additionally attaching at least one of the third support stick 55-1 and the fourth support stick 56-1 on the mask frame 30-1, or removing at least one of the third support stick 55-1 and the fourth support stick 56-1 from the mask frame 30-1.

In an exemplary embodiment, in the case where the mask frame 30-1 is deformed as in FIG. 8, at least one new third support stick 55-1 may be further added on an upper portion of the first deformation prevention groove 51-1 and fixed on the mask frame 30-1 in addition to the third support sticks 55-1 arranged in advance on the mask frame 30-1 as shown in FIG. 9. In another exemplary embodiment, at least one of the third support sticks 55-1 arranged in advance on a lower portion of the first deformation prevention groove 51-1 may be removed from the mask frame 30-1 in FIG. 8. In another exemplary embodiment, at least one new fourth support stick 56-1 may be further added on a lower portion of the second deformation prevention groove 53-1 and fixed on the mask frame 30-1 in addition to the fourth support sticks 56-1 arranged in advance on the mask frame 30-1 in FIG. 8. In another exemplary embodiment, at least one of the fourth support sticks 56-1 arranged in advance on an upper portion of the second deformation prevention groove 53-1 may be removed from the mask frame 30-1 in FIG. 8. In another exemplary embodiment, at least one new third support stick 55-1 may be added on the upper portion of the first deformation prevention groove 51-1 in FIG. 8, and at least one of the fourth support sticks 56-1 arranged in advance on the upper portion of the second deformation prevention groove 53-1 may be removed from the mask frame 30-1 in FIG. 8. In another exemplary embodiment, at least one of the third support sticks 55-1 arranged on the lower portion of the first deformation prevention groove 51-1 may be removed from the mask frame 30-1 in FIG. 8, and at least one of the fourth support sticks 56-1 arranged in advance on the upper portion of the second deformation prevention groove 53-1 may be removed from the mask frame 30-1 in FIG. 8. In another exemplary embodiment, at least one new third support stick 55-1 may be added on the upper portion of the first deformation prevention groove 51-1 in addition to the third support sticks 55-1 arranged in advance, and at least one new fourth support stick 56-1 may be added on the lower portion of the second deformation prevention groove 53-1 and fixed on the mask frame 30-1 in addition to the fourth support sticks 56-1 arranged in advance in FIG. 8. In another exemplary embodiment, at least one of the third support sticks 55-1 arranged in advance on the upper portion of the first deformation prevention groove 51-1 may be removed from the mask frame 30-1, and at least one of the fourth support sticks 56-1 arranged in advance on the lower portion of the second deformation prevention groove 53-1 may be removed from the mask frame 30-1 in FIG. 8. In this example, in the case where the support stick is added, compression force applied on a portion of the mask frame 30-1 to which the support stick has been added is further increased over the initial state, and compression force that has been initially applied on a portion of the mask frame 30-1 from which the support stick has been removed may be reduced. Hereinafter, for convenience of description, the case where only at least one new third support stick 55-1 is added on the upper portion of the first deformation prevention groove 51-1 as shown in FIG. 9 is mainly described in detail. In this case, the upper portion and the lower portion of the first deformation prevention groove 51-1 may be determined based on a line segment that passes through a center of the first deformation prevention groove 51-1 and parallel to the mask frame 30-1. Also, the upper portion and the lower portion of the second deformation prevention groove 53-1 may be determined based on a line segment that passes through a center of the second deformation prevention groove 53-1 and parallel to the mask frame 30-1.

In the case where two new third support sticks 55-1 are further added on the upper portion of the first deformation prevention groove 51-1, since tensile force has been applied to the new third support sticks 55-1, the new third support sticks 55-1 may further provide compression force on only a portion of a short side of the mask frame 30-1. Particularly, in the case where the new third support sticks 55-1 are further added as in FIG. 9, compression force may be further applied on only an upper portion of the short side of the mask frame 30-1 than the initial state. In the case where the new third support sticks 55-1 are arranged and fixed on the mask frame 30-1, compression force applied on the mask frame 30-1 may vary due to the new third support stick 55-1. Particularly, in the case where the new third support stick 55-1 is arranged and fixed on the mask frame 30-1 as in FIG. 9, compression force applied on the left of the long side of the mask frame 30-1 may be greater than compression force applied on the right of the long side of the mask frame 30-1. As shown in FIG. 9, such a difference in the compression force may move one end of the long side of the mask frame 30-1 arranged on an upper portion of FIG. 9 to the left of FIG. 9.

Since the mask frame 30-1 becomes the same or substantially the same shape as the initial shape of the mask frame 30-1, deformation of the mask frame 30-1 may be corrected.

Therefore, since the mask assembly may maintain an initially designed shape, a display device having an accurate deposition pattern may be manufactured by this deformation correction technique.

Also, deformation of the mask assembly may be corrected by using a simple structure without compromising the integrity of the mask assembly that has been deformed.

Furthermore, since the mask assembly may correct deformation of the mask frame 30-1 that occurs during a deposition process simply and quickly, manufacturing time and manufacturing costs of the display device may be reduced.

Figure 10:
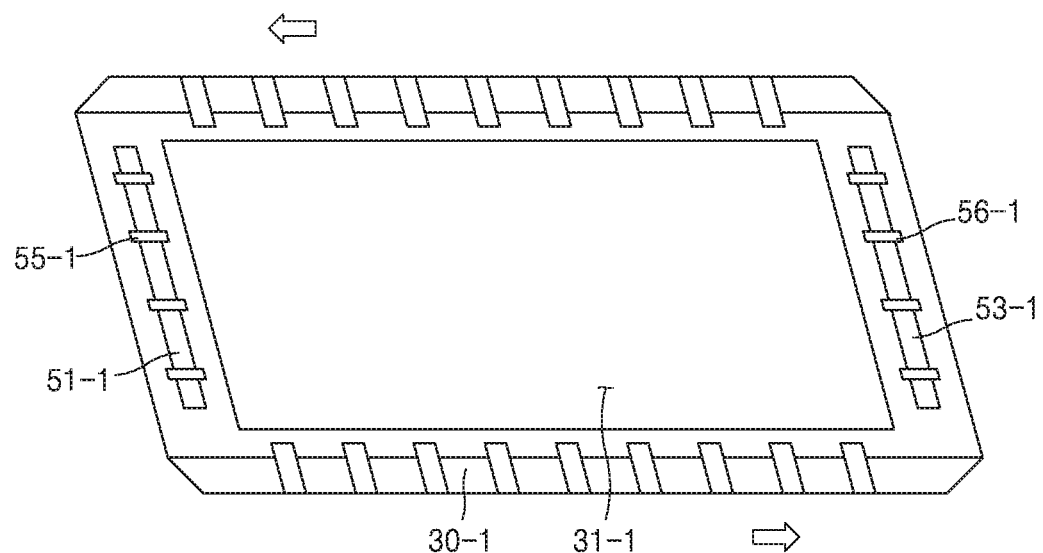
FIG. 10 is a plan view of an exemplary embodiment of a fourth deformed shape of the mask frame shown in FIG. 7.
Figure 11:
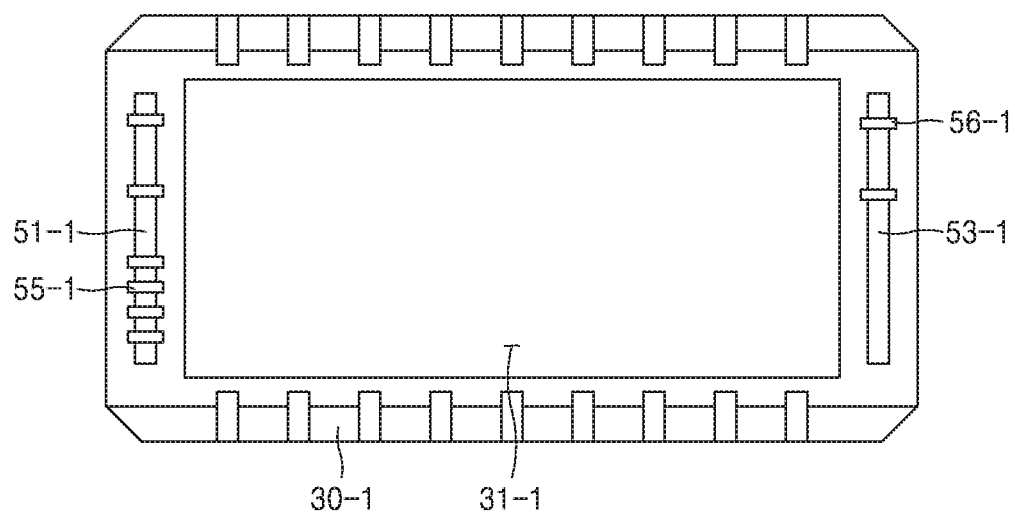
FIG. 11 is a plan view of the mask frame shown in FIG. 10 after the deformation has been corrected.

FIG. 10 is a plan view of an exemplary embodiment of a fourth deformed shape of the mask frame 30-1 shown in FIG. 7, and FIG. 11 is a plan view of the mask frame 30-1 shown in FIG. 10 after the deformation has been corrected.

Referring to FIGS. 10 and 11, while a mask assembly is manufactured, after the mask frame 30-1 is manufactured, while the mask frame 30-1 is used by an apparatus for manufacturing a display device, or after the mask frame 30-1 is used by the apparatus for manufacturing a display device, the mask frame 30-1 may become deformed from an initial state when only the mask frame 30-1 is manufactured, or become deformed from the state of the mask frame 30-1 having the design shape of the mask assembly.

For example, as shown in FIG. 10, compared to an initial state, one of the long sides (e.g., upper long side) of the mask frame 30-1 may move to the left of FIG. 10, and the other of the long sides (e.g., bottom long side) of the mask frame 30-1 may move to the right of FIG. 10 due to various reasons, and accordingly, the shape of the mask frame 30-1 may vary.

Deformation of the mask frame 30-1 may be corrected by additionally attaching at least one of the third support stick 55-1 and the fourth support stick 56-1 on the mask frame 30-1, or removing at least one of the third support stick 55-1 and the fourth support stick 56-1 from the mask frame 30-1. In this case, the method of additionally attaching the at least one of the third support stick 55-1 and the fourth support stick 56-1 on the mask frame 30-1, or removing the at least one of the third support stick 55-1 and the fourth support stick 56-1 from the mask frame 30-1 may be substantially similar to the method described with reference to FIGS. 8 and 9.

In an exemplary embodiment, in the case where the mask frame 30-1 is deformed as in FIG. 10, at least one new third support stick 55-1 may be further added on the lower portion of the first deformation prevention groove 51-1 and fixed on the mask frame 30-1 in addition to the third support sticks 55-1 arranged in advance on the mask frame 30-1 as shown in FIG. 11. In another exemplary embodiment, at least one of the third support sticks 55-1 arranged in advance on the upper portion of the first deformation prevention groove 51-1 may be removed from the mask frame 30-1 in FIG. 10. In another exemplary embodiment, at least one new fourth support stick 56-1 may be further added on the upper portion of the second deformation prevention groove 53-1 and fixed on the mask frame 30-1 in addition to the fourth support sticks 56-1 arranged in advance on the mask frame 30-1 in FIG. 10. In another exemplary embodiment, at least one of the fourth support sticks 56-1 arranged in advance on the lower portion of the second deformation prevention groove 53-1 may be removed from the mask frame 30-1 in FIG. 10. In another exemplary embodiment, at least one new third support stick 55-1 may be added on the lower portion of the first deformation prevention groove 51-1 in FIG. 10, and at least one of the fourth support sticks 56-1 arranged in advance on the lower portion of the second deformation prevention groove 53-1 may be removed from the mask frame 30-1 in FIG. 10. In another exemplary embodiment, at least one of the third support sticks 55-1 arranged on the upper portion of the first deformation prevention groove 51-1 may be removed from the mask frame 30-1 in FIG. 10, and at least one of the fourth support sticks 56-1 arranged in advance on the lower portion of the second deformation prevention groove 53-1 may be removed from the mask frame 30-1 in FIG. 10. In another exemplary embodiment, at least one new third support stick 55-1 may be added on the lower portion of the first deformation prevention groove 51-1 in addition to the third support sticks 55-1 arranged in advance, and at least one new fourth support stick 56-1 may be added on the upper portion of the second deformation prevention groove 53-1 and fixed on the mask frame 30-1 in addition to the fourth support sticks 56-1 arranged in advance in FIG. 10. In another exemplary embodiment, at least one of the third support sticks 55-1 arranged in advance on the lower portion of the first deformation prevention groove 51-1 may be removed from the mask frame 30-1, and at least one of the fourth support sticks 56-1 arranged in advance on the upper portion of the second deformation prevention groove 53-1 may be removed from the mask frame 30-1 in FIG. 10. In this case, in the case where the support stick is added, compression force applied on a portion of the mask frame 30-1 to which the support stick has been added is further increased over the initial state, and compression force that has been initially applied on a portion of the mask frame 30-1 from which the support stick has been removed may be reduced. Hereinafter, for convenience of description, the case where at least one new third support stick 55-1 is arranged on the lower portion of the first deformation prevention groove 51-1 and added on the mask frame 30-1, and at least one of the fourth support sticks 56-1 arranged in advance on the upper portion of the second deformation prevention groove 53-1 is removed from the mask frame 30-1 as shown in FIG. 11 is mainly described in detail. In this case, the upper portion and the lower portion of the first deformation prevention groove 51-1 may be determined based on a line segment that passes through a center of the first deformation prevention groove 51-1 and parallel to the mask frame 30-1. Also, the upper portion and the lower portion of the second deformation prevention groove 53-1 may be determined based on a line segment that passes through a center of the second deformation prevention groove 53-1 and parallel to the mask frame 30-1.

In the case where the new third support stick 55-1 is added on the mask frame 30-1, since tensile force is applied to the new third support stick 55-1, compression force may be further provided on only a portion of a short side of the mask frame 30-1 than an initial state. Also, in the case where at least one of the fourth support sticks 56-1 arranged in advance is removed from the mask frame 30-1, since a portion of compression force applied in advance on the mask frame 30-1 is removed, compression force that has been applied in advance on the mask frame 30-1 may be reduced. Particularly, as shown in FIG. 11, in the case where the third support stick 55-1 is further added, compression force may be further applied to only the lower portion of the short side of the mask frame 30-1 than the initial state. As shown in FIG. 11, such compression force may pull one end of the long side of the mask frame 30-1 arranged on a lower portion of FIG. 11 to the left of FIG. 11. In this case, in compression force applied to two opposite ends of the long side of the mask frame 30-1 arranged on the lower portion of FIG. 11, compression force on the left of the two opposite ends of the mask frame 30-1 may be greater than compression force on the right of the two opposite ends of the mask frame 30-1. In this case, the long side of the mask frame 30-1 may move to the right as shown in FIG. 11. Also, as shown in FIG. 11, in the case where at least one of the fourth support sticks 56-1 arranged in advance on the upper portion of the second deformation prevention groove 53-1 is removed, compression force applied to the mask frame 30-1 may be reduced compared to the initial state. In this case, in compression force applied to two opposite ends of the long side of the mask frame 30-1 arranged on an upper portion of FIG. 11, compression force on the left of the two opposite ends of the mask frame 30-1 may be greater than compression force on the right of the two opposite ends of the mask frame 30-1. In this case, the long side of the mask frame 30-1 arranged on the upper portion of FIG. 11 may move to the left.

In this case, since the mask frame 30-1 becomes a shape that is the same as or almost substantially similar to a shape of the initial mask frame 30-1, deformation of the mask frame 30-1 may be corrected.

Therefore, since the mask assembly (not shown) may maintain an initially designed shape, a display device (not shown) having an accurate deposition pattern may be manufactured through this technique.

Also, deformation of the mask assembly may be corrected by using a simple structure without compromising the integrity of the mask assembly that has been deformed.

Furthermore, since the mask assembly may correct deformation of the mask frame 30-1 that occurs during a deposition process simply and quickly, a manufacturing time and manufacturing costs of the display device may be reduced.

Figure 12:
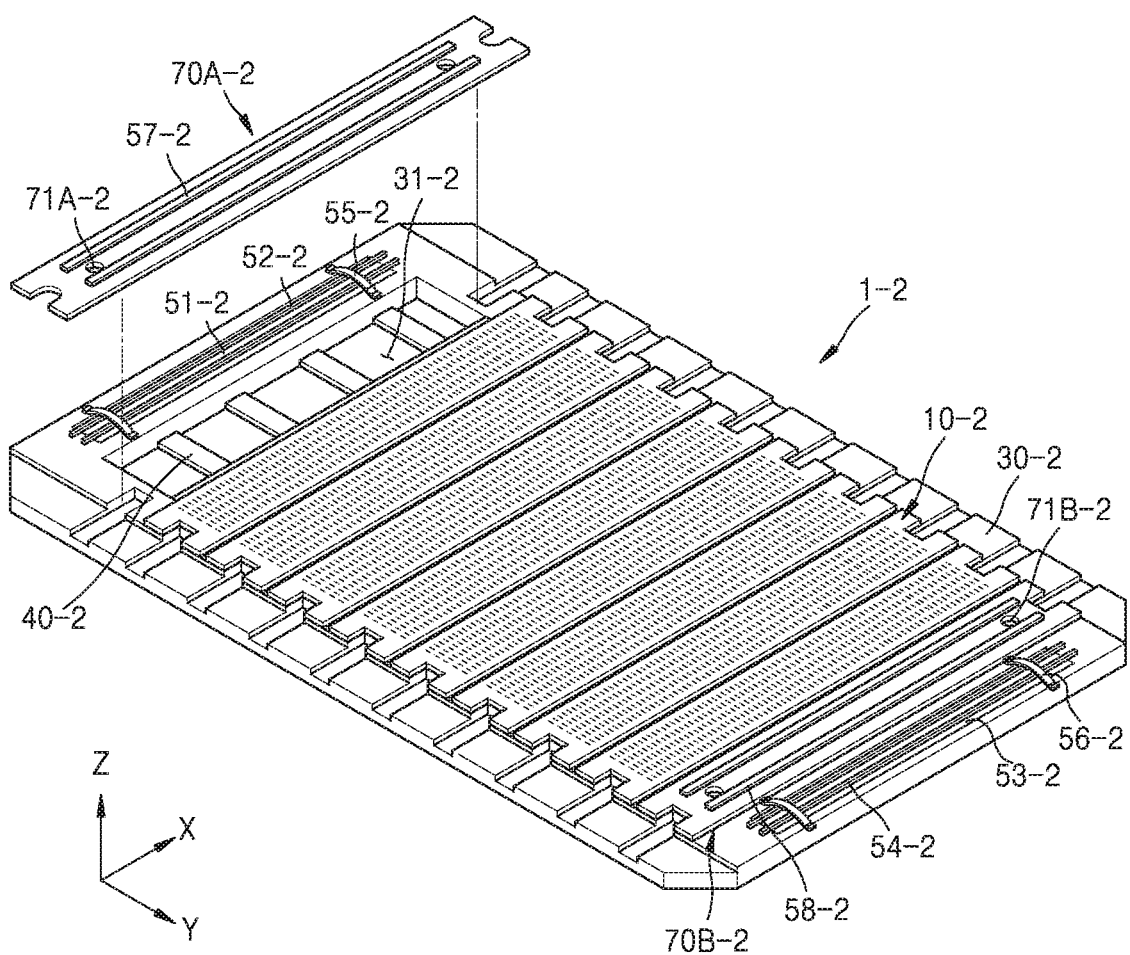
FIG. 12 is a perspective view of still another exemplary embodiment of a mask assembly constructed according to the principles of the invention.

FIG. 12 is a perspective view of still another exemplary embodiment of a mask assembly 1-2 constructed according to the principles of the invention.

Referring to FIG. 12, since the apparatus for manufacturing a display device is the same as or substantially similar to that shown in FIG. 1, detailed description thereof is omitted to avoid redundancy.

A mask assembly 1-2 may include the mask frame 30-1, a mask sheet 10-2, a support frame 40-2, a support stick 52-2, 54-2, 55-2, 56-2, and an alignment sheet 70A-2, 70B-2. Since the mask frame 30-1, the mask sheet 10-2, and the support frame 40-2 are the same as or substantially similar to those described above, detailed description thereof is omitted to avoid redundancy.

The support stick may include a first support stick 52-2 and a third support stick 55-2 arranged on a first deformation prevention groove 51-2, and a second support stick 54-2 and a fourth support stick 56-2 arranged on a second deformation prevention groove 53-2. In this case, since the first support sticks 52-2 to the fourth support stick 56-2 are the same as or substantially similar to those described above, detailed description thereof is omitted to avoid redundancy.

The support stick may include a fifth support stick 57-2 and a sixth support stick 58-2 arranged on the alignment sheet 70A-2, 70B-2 in addition to the first support stick 52-2 to the fourth support stick 56-2. In this case, the fifth support stick 57-2 and the sixth support stick 58-2 may be arranged on the alignment sheet 70A-2, 70B-2 to correct deformation of the mask frame 30-2. The fifth support stick 57-2 and the sixth support stick 58-2 may be formed the same as or substantially similar to the first support stick 52-2 to the second support stick 54-2.

The alignment sheet 70A-2, 70B-2 may be arranged on the mask frame 30-2 and used to determine a location relative to the mask assembly 1-2 and a display substrate (D of FIG. 1) while the alignment sheet is aligned with the display substrate. In this case, the alignment sheet may include an alignment hole 71A-2, 71B-2.

The alignment sheet 70A-2, 70B-2 may be arranged on the mask frame 30-2 with tensile force applied. In this case, in an exemplary embodiment, the alignment sheet 70A-2, 70B-2 may be arranged on an outermost portion of an opening 31-2 of the mask frame 30-2. In another exemplary embodiment, the alignment sheet 70A-2, 70B-2 may be arranged such that at least a portion of the alignment sheet overlaps a short side of the mask frame 30-2. In this case, a separate opening may be formed in a short side of the mask frame 30-2 to correspond to the alignment hole 71A-2, 71B-2. Hereinafter, for convenience of description, the case where the alignment sheet 70A-2, 70B-2 is arranged on an outermost portion of the opening 31-2, and the alignment sheet 70A-2, 70B-2 is arranged on the mask frame 30-2 such that the alignment hole 71A-2, 71B-2 of the alignment sheet 70A-2, 70B-2 completely overlaps the opening 31-2 is mainly described in detail.

The alignment sheet 70A-2, 70B-2 may be provided as at least one alignment sheet. In this case, one alignment sheet may be provided on two opposite sides of the opening 31-2 of the mask frame 30-2. For example, the alignment sheet may include a first alignment sheet 70A-2 in which a first alignment hole 71A-2 is formed, and a second alignment sheet 70B-2 in which a second alignment hole 71B-2 is formed. The first alignment sheet 70A-2 and the second alignment sheet 70B-2 may be spaced apart from each other and formed same or substantially similar to each other. In this case, the fifth support stick 57-2 may be arranged on the first alignment sheet 70A-2, and the sixth support stick 58-2 may be arranged on the second alignment sheet 70B-2.

The mask assembly 1-2 may be assembled and manufactured as described with reference to FIG. 2. In this case, deformation of the mask frame 30-2 may occur due to various reasons. The deformation of the mask frame 30-2 may not only change a location of the mask sheet 10-2 but also vary a shape of the opening 31-2. Particularly, such deformation may transform a pattern of a deposition material that passes through the mask assembly 1-2 and is deposited on the display substrate, and cause a defect of a manufactured display device including the display substrate by changing a deposition location of the deposition material.

To correct deformation of the mask frame 30-2, at least one of the first support stick 52-2 to the sixth support stick 58-2 may be arranged on the mask assembly 1-2 or removed from the mask assembly 1-2.

For example, in the case where the mask frame 30-2 is deformed as shown in FIGS. 3 and 5, in an exemplary embodiment, at least one of the first support stick 52-2 and the second support stick 54-2 may be removed from the mask frame 30-2, or at least one of the first support stick 52-2 and the second support stick 54-2 may be added on the mask frame 30-2. In another exemplary embodiment, at least one of the fifth support stick 57-2 and the sixth support stick 58-2 may be removed from the alignment sheet, or at least one of the fifth support stick 57-2 and the sixth support stick 58-2 may be added on the alignment sheet 70A-2, 70B-2. In another exemplary embodiment, at least one of the fifth support stick 57-2 and the sixth support stick 58-2 may be removed from the alignment sheet 70A-2, 70B-2 while at least one of the first support stick 52-2 and the second support stick 54-2 may be removed from the mask frame 30-2, or at least one of the fifth support stick 57-2 and the sixth support stick 58-2 may be added on the alignment sheet 70A-2, 70B-2 while at least one of the first support stick 52-2 and the second support stick 54-2 may be added on the mask frame 30-2. In this case, an effect and an operation when at least one of the fifth support stick 57-2 and the sixth support stick 58-2 is removed from the alignment sheet 70A-2, 70B-2, or at least one of the fifth support stick 57-2 and the sixth support stick 58-2 is added on the alignment sheet 70A-2, 70B-2 may be the same as an effect and an operation when at least one of the first support stick 52-2 and the second support stick 54-2 is removed from the mask frame 30-2, or at least one of the first support stick 52-2 and the second support stick 54-2 is added on the mask frame 30-2 described with reference to FIGS. 3 and 5.

In addition to the above cases, the mask frame 30-2 may be equally deformed as shown in FIGS. 8 and 10. In this case, the deformation of the mask frame 30-2 may be corrected by arranging the third support stick 55-2 and the fourth support stick 56-2 on the mask frame 30-2 equally or similarly as shown in FIGS. 9 and 11.

Also, in the case where a combination of the deformations of the mask frame 30-2 shown in FIGS. 3, 5, 8, and 10 occurs, or in the case where new deformation of the mask frame 30-2 occurs after one deformation of the mask frame 30-2 is corrected, the deformation of the mask frame 30-2 may be corrected by combining the above cases to add at least one of the first support stick 52-2 to the sixth support stick 58-2 on the mask assembly 1-2, or remove at least one of the first support stick 52-2 to the sixth support stick 58-2 from the mask assembly 1-2.

Therefore, since the mask assembly 1-2 may maintain the initial designed shape, the display device having an accurate deposition pattern may be manufactured through this technique.

Also, deformation of the mask assembly 1-2 may be corrected by using a simple structure without compromising the integrity of the mask assembly 1-2 that has been deformed.

Furthermore, since the mask assembly 1-2 may correct deformation of the mask frame 30-2 that occurs during a deposition process simply and quickly, manufacturing time and manufacturing costs of the display device may be reduced.

Figure 13:
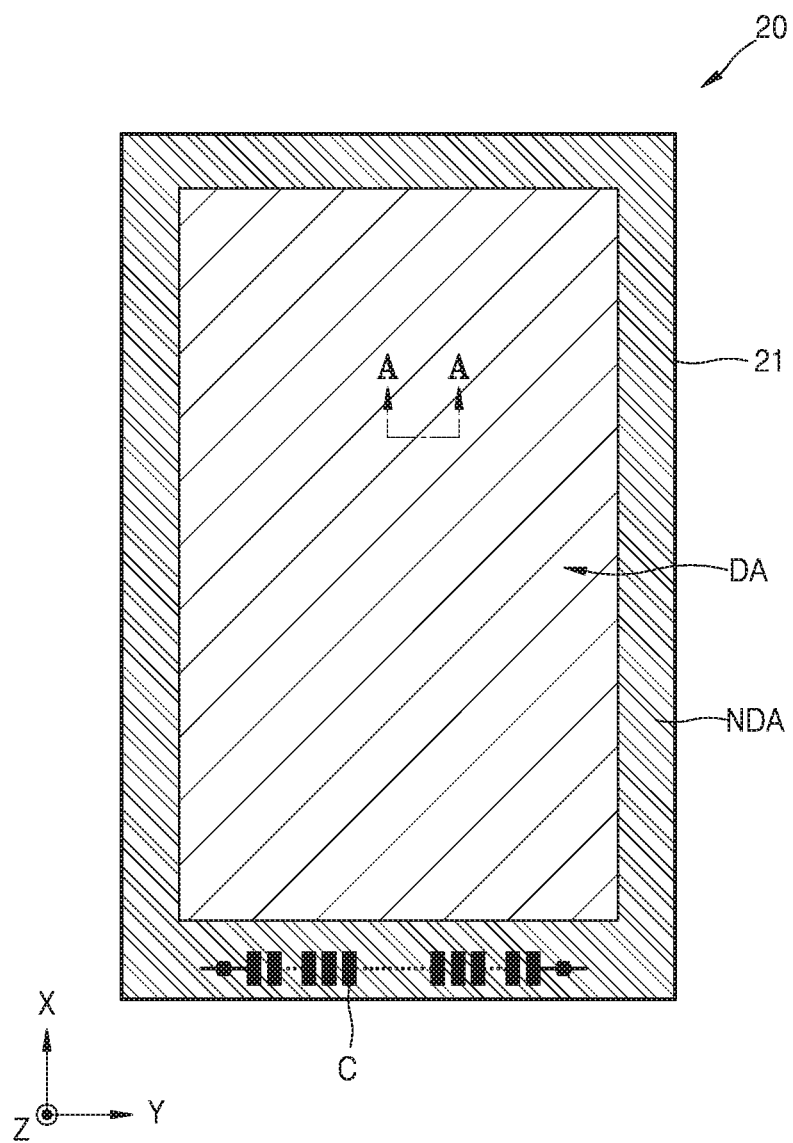
FIG. 13 is a plan view of an exemplary embodiment of a display device manufactured by an apparatus for manufacturing a display device including the mask assembly shown in FIG. 2, 7, or 12.

FIG. 13 is a plan view of an exemplary embodiment of a display device 20 manufactured by an apparatus for manufacturing a display device including the mask assembly shown in FIG. 2, 7, or 12, and FIG. 14 is a cross-sectional view taken along line A-A of FIG. 13.

Figure 14:
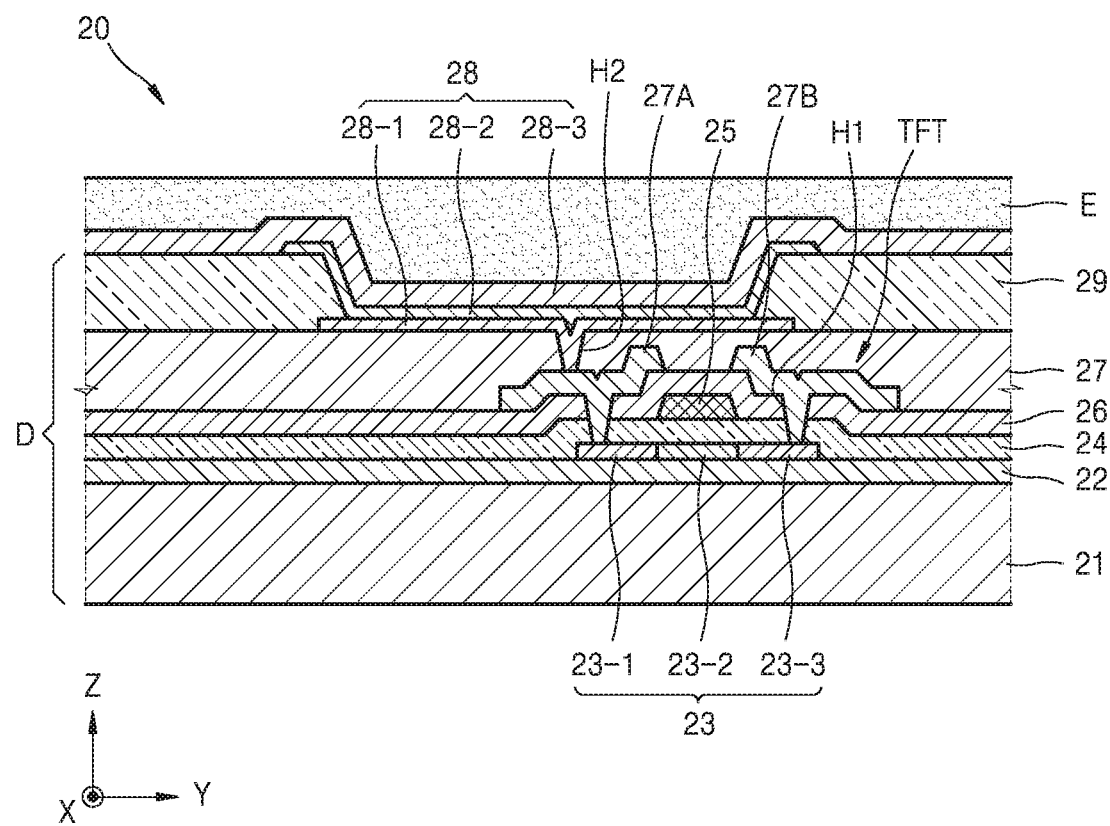
FIG. 14 is a cross-sectional view taken along line A-A of FIG. 13.

Referring to FIGS. 13 and 14, the display device 20 may define a display area DA and a non-display area NDA outside the display area DA in a substrate 21. An emission unit may be arranged in the display area DA, and a power wiring (not shown), etc. may be arranged in the non-display area NDA. Also, a pad unit C may be arranged in the non-display area NDA.

The display device 20 may include the display substrate D and a thin-film encapsulation layer E. In this case, the display substrate D may include a substrate 21, a thin film transistor TFT, a passivation layer 27, and a pixel electrode 28-1. In another exemplary embodiment, the display substrate D may include the substrate 21, the thin film transistor TFT, the passivation layer 27, the pixel electrode 28-1, and a portion of an intermediate layer 28-2. In another exemplary embodiment, the display substrate D may include the substrate 21, the thin film transistor TFT, the passivation layer 27, the pixel electrode 28-1, and the intermediate layer 28-2. Hereinafter, for convenience of description, the case where the display substrate D includes the substrate 21, the thin film transistor TFT, the passivation layer 27, and the pixel electrode 28-1 is mainly described in detail.

The substrate 21 may include a plastic material and include a metal material such as SUS and Ti. Also, the substrate 21 may include polyimide (PI). Hereinafter, for convenience of description, the case where the substrate 21 includes PI is mainly described in detail.

The thin film transistor TFT is arranged over the substrate 21, and the passivation layer 27 covers the thin film transistor TFT. An organic light-emitting diode 28 may be arranged on the passivation layer 27.

A buffer layer 22 may be further arranged on a top surface of the substrate 21, the buffer layer 22 including an organic compound and/or an inorganic compound (SiOx (x>1) and SiNx (x>1)).

After an active layer 23 is formed on the buffer layer 22 in a predetermined pattern, the active layer 23 is buried by a gate insulating layer 24. The active layer 23 includes a source region 23-1 and a drain region 23-3 and further includes a channel region 23-2 therebetween.

The active layer 23 may include various materials. For example, the active layer 23 may include an inorganic semiconductor material such as amorphous silicon or crystalline silicon. In another exemplary embodiment, the active layer 23 may include an oxide semiconductor. In another exemplary embodiment, the active layer 23 may include an organic semiconductor material. However, hereinafter, for convenience of description, the case where the active layer 23 includes amorphous silicon is mainly described in detail.

The active layer 23 may be formed by forming an amorphous silicon layer on the buffer layer 22, crystallizing the amorphous silicon layer into a polycrystalline silicon layer, and patterning the polycrystalline silicon layer. The source region 23-1 and the drain region 23-3 of the active layer 23 are doped with impurities depending on a kind of a TFT such as a driving TFT (not shown), a switching TFT (not shown), etc.

A gate electrode 25 corresponding to the active layer 23, and an interlayer insulating layer 26 burying the gate electrode 25 are formed on a top surface of the gate insulating layer 24.

Also, after contact holes H1 are formed in the interlayer insulating layer 26 and the gate insulating layer 24, a source electrode 27-1 and a drain electrode 27-2 are formed on the interlayer insulating layer 26 such that the source electrode 27-1 and the drain electrode 27-2 respectively contact the source region 23-1 and the drain region 23-3.

The passivation layer 27 is formed on the thin film transistor TFT formed in this manner, and the pixel electrode 28-1 of the organic light-emitting diode 28 is formed on the passivation layer 27. The pixel electrode 28-1 contacts the drain electrode 27-2 of the thin film transistor TFT through a via hole H2 formed in the passivation layer 27. The passivation layer 27 may include an inorganic material and/or an organic material and include a single layer or two or more layers. The passivation layer 27 may be provided as a planarization layer such that a top surface thereof is flat regardless of bending of a layer thereunder, or may be provided such that a top surface thereof is uneven along bending of a layer located thereunder. Also, it is preferable that the passivation layer 27 includes a transparent insulator to accomplish a resonance effect.

After the pixel electrode 28-1 is formed on the passivation layer 27, a pixel-defining layer 29 covers the pixel electrode 28-1 and the passivation layer 27, the pixel-defining layer 29 including an organic material and/or an inorganic material. Part of the pixel electrode 28-1 is exposed.

Also, the intermediate layer 28-2 and an opposite electrode 28-3 are formed on at least the pixel electrode 28-1. In another exemplary embodiment, the opposite electrode 28-3 may be formed on an entire surface of the display substrate D. In this case, the opposite electrode 28-3 may be formed on the intermediate layer 28-2 and the pixel-defining layer 29. Hereinafter, for convenience of description, the case where the opposite electrode 28-3 is formed on the intermediate layer 28-2 and the pixel-defining layer 29 is mainly described in detail.

The pixel electrode 28-1 serves as an anode electrode, and the opposite electrode 28-3 serves as a cathode electrode. Polarities of the pixel electrode 28-1 and the opposite electrode 28-3 may be reversed.

The pixel electrode 28-1 and the opposite electrode 28-3 are insulated from each other by the intermediate layer 28-2. An organic emission layer is allowed to emit light by applying voltages having different polarities to the intermediate layer 28-2.

The intermediate layer 28-2 may include an organic emission layer. In an exemplary embodiment, the intermediate layer 28-2 may include an organic emission layer and further include at least one of a hole injection layer (HIL), a hole transport layer, an electron transport layer, and an electron injection layer. The illustrated exemplary embodiment is not limited thereto and the intermediate layer 28-2 may include an organic emission layer and further include other various functional layers (not shown).

The intermediate layer 28-2 may be provided as a plurality of intermediate layers. The plurality of intermediate layers 28-2 may constitute the display area DA. In this case, the plurality of intermediate layers 28-2 may be spaced apart from each other inside the display area DA.

Each unit pixel may include a plurality of sub-pixels, and the plurality of sub-pixels may emit light of various colors. For example, the plurality of sub-pixels may respectively include sub-pixels respectively emitting red, green, and blue lights, or respectively include sub-pixels (not shown) respectively emitting red, green, blue, and white lights.

The apparatus (1 of FIG. 1) for manufacturing a display device may form various layers on the display substrate D. For example, the apparatus for manufacturing a display device may form at least one of at least one layer of the intermediate layer 28-2. For example, the apparatus for manufacturing a display device may form at least one of an organic emission layer, a hole injection layer, a hole transport layer, an electron injection layer, an electron transport layer, and a functional layer of the intermediate layer 28-2.

The thin-film encapsulation layer E may include a plurality of inorganic layers or include an inorganic layer and an organic layer.

The organic layer of the thin-film encapsulation layer E may include a polymer and include polyethylene terephthalate, polyethylene naphthalate, polycarbonate, polyimide, polyethylene sulfonate, polyoxymethylene, polyarylate, hexamethyldisiloxane, an acrylic-based resin (e.g. polymethyl methacrylate, polyacrylic acid), or an arbitrary combination thereof.

The inorganic layer of the thin-film encapsulation layer E may include a single layer or a stacked layer including a metal oxide or a metal nitride. Specifically, the inorganic layer may include one of $SiN_x$, $Al_2O_3$, $SiO_2$, and $TiO_2$.

An uppermost layer of the thin-film encapsulation layer E exposed to the outside may include an inorganic layer so as to prevent moisture transmission to the organic light-emitting diode.

The thin-film encapsulation layer E may include at least one sandwich structure in which at least one organic layer is inserted between at least two inorganic layers. In another exemplary embodiment, the thin-film encapsulation layer E may include at least one sandwich structure in which at least one inorganic layer is inserted between at least two organic layers. In another exemplary embodiment, the thin-film encapsulation layer E may a sandwich structure in which at least one organic layer is inserted between at least two inorganic layers, and a sandwich structure in which at least one inorganic layer is inserted between at least two organic layers.

The thin-film encapsulation layer E may include a first inorganic layer, a first organic layer, and a second inorganic layer sequentially above the organic light-emitting diode OLED.

In another exemplary embodiment, the thin-film encapsulation layer E may include a first inorganic layer, a first organic layer, a second inorganic layer, a second organic layer, and a third inorganic layer sequentially above the organic light-emitting diode OLED.

In another exemplary embodiment, the thin-film encapsulation layer E may include a first inorganic layer, a first organic layer, a second inorganic layer, a second organic layer, a third inorganic layer, a third organic layer, and a fourth inorganic layer sequentially above the organic light-emitting diode OLED.

A halogenated metal layer including LiF may be additionally included between the organic light-emitting diode OLED and the first inorganic layer. The halogenated metal layer may prevent the organic light-emitting diode OLED from being damaged while the first inorganic layer is formed by sputtering.

An area of the first organic layer may be less than an area of the second inorganic layer, and an area of the second organic layer may be less than an area of the third inorganic layer.

In the case where the plurality of inorganic layers are provided as described above, the inorganic layers may be deposited such that the inorganic layers directly contact each other at an edge area of the display device 20 and may prevent the organic layer from being exposed to the outside.

Therefore, the display device 20 may produce a fine image.

In the mask assembly according to exemplary embodiments, in the case where deformation of the mask frame occurs, the deformation may be corrected easily and quickly. The apparatus for manufacturing the display device and the method of manufacturing the display device according to exemplary embodiments may produce a display device including an accurate pattern by using a mask assembly with minimum deformation. Also, the apparatus for manufacturing the display device and the method of manufacturing the display device according to exemplary embodiments may minimize the defect rate while a display device is manufactured.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising:
   sensing deformation of a mask frame having a first central opening to receive a mask sheet and a second opening in an outer peripheral portion of the mask frame;
   correcting the deformation of the mask frame by selectively attaching a support member to the second opening or removing a support member from the second opening depending upon the shape of the mask frame; and
   arranging a mask assembly including the mask frame in which the deformation has been corrected inside a deposition chamber, and then supplying and depositing a deposition material on a display substrate of the display device by using a deposition source.

2. The method of claim 1, wherein the step of attaching a support member comprises: arranging and fixing the support member on the mask frame by attaching the support member across the second opening with tensile force applied.

3. The method of claim 1, wherein the support member comprises a plurality of first and second support sticks, and the method further comprises:
   arranging the first support sticks and the second support sticks on portions of the mask frame depending on the deformation of the mask frame, the portions of the mask frame being different from each other with respect to a center of the mask frame.

4. The method of claim 3, wherein the number of the first support sticks and the number of the second support sticks are different from each other.

5. The method of claim 1, wherein the second opening comprises a groove and the support member crosses the groove in a width direction or lengthwise direction of the groove.

* * * * *